United States Patent
Lai et al.

(10) Patent No.: US 11,462,539 B2
(45) Date of Patent: Oct. 4, 2022

(54) CROWN CAPACITOR AND METHOD FOR FABRICATING THE SAME

(71) Applicant: NANYA TECHNOLOGY CORPORATION, New Taipei (TW)

(72) Inventors: Jen-I Lai, Taoyuan (TW); Chun-Heng Wu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/010,843

(22) Filed: Sep. 3, 2020

(65) Prior Publication Data

US 2022/0069070 A1    Mar. 3, 2022

(51) Int. Cl.
*H01L 27/108*  (2006.01)
*H01L 49/02*   (2006.01)
*H01L 29/92*   (2006.01)

(52) U.S. Cl.
CPC ............ *H01L 27/108* (2013.01); *H01L 28/40* (2013.01); *H01L 28/92* (2013.01); *H01L 29/92* (2013.01)

(58) Field of Classification Search
None
See application file for complete search history.

(56) References Cited

U.S. PATENT DOCUMENTS

| | | | | |
|---|---|---|---|---|
| 6,037,220 A | * | 3/2000 | Chien | H01L 27/10852 |
| | | | | 438/398 |
| 6,222,722 B1 | * | 4/2001 | Fukuzumi | H01L 28/82 |
| | | | | 257/E21.018 |
| 10,559,568 B1 | * | 2/2020 | Huang | H01L 28/92 |
| 2004/0145057 A1 | * | 7/2004 | Choi | H01L 27/10852 |
| | | | | 257/E21.648 |
| 2011/0124176 A1 | * | 5/2011 | Lim | H01L 27/10817 |
| | | | | 438/396 |
| 2013/0252398 A1 | * | 9/2013 | Shea | H01L 28/92 |
| | | | | 438/386 |
| 2017/0213884 A1 | * | 7/2017 | Balakrishnan | |
| | | | | H01L 21/823814 |
| 2020/0126994 A1 | * | 4/2020 | Huang | H01L 28/87 |

FOREIGN PATENT DOCUMENTS

| CN | 110970402 A | 4/2020 |
|---|---|---|
| TW | 423145 | 2/2001 |
| TW | 202011611 A | 3/2020 |

* cited by examiner

*Primary Examiner* — Steven M Christopher
(74) *Attorney, Agent, or Firm* — CKC & Partners Co., LLC

(57) ABSTRACT

A method for fabricating a crown capacitor includes: forming a first supporting layer over a substrate; forming a second supporting layer above the first supporting layer; alternatively stacking first and second sacrificial layers between the first and second supporting layers to collectively form a stacking structure; forming a recess extending through the stacking structure; performing an etching process to the first sacrificial layers at a first etching rate and the second sacrificial layers at a second etching rate greater than the first etching rate, such that each second sacrificial layer and immediately-adjacent two of the first sacrificial layers collectively define a concave portion; forming a first electrode layer over a surface of the recess in which the first electrode layer has a wavy structure; removing the first and second sacrificial layers; and forming a dielectric layer and a second electrode layer over the first electrode layer.

12 Claims, 11 Drawing Sheets

CROWN CAPACITOR AND METHOD FOR FABRICATING THE SAME

BACKGROUND

Field of Invention

The present invention relates to a capacitor and a method for fabricating the same. Specifically, the present invention is related to a crown capacitor and a method for fabricating the same.

Description of Related Art

Regarding semiconductor devices, such as a Dynamic Random Access Memory (DRAM), it has been known that a capacitor, which has the same structure as of a memory cell capacitor, is used as a compensation capacitor.

As the recent tendency, capacitance of the memory cell capacitor has become critical in order to support electrical devices' multifunction. If the capacitance is not high enough, some functions thereof may not operate well or even stop.

Therefore, there is a need to develop a method to increase capacitance of memory cell capacitors and solve the aforementioned problems.

SUMMARY

The disclosure provides a method for fabricating a crown capacitor includes: forming a first supporting layer over a substrate; forming a second supporting layer above the first supporting layer; alternatively stacking first and second sacrificial layers between the first and second supporting layers to collectively form a stacking structure; forming a recess extending through the stacking structure; performing an etching process to the first sacrificial layers at a first etching rate and the second sacrificial layers at a second etching rate greater than the first etching rate, such that each second sacrificial layer and immediately-adjacent two of the first sacrificial layers collectively define a concave portion; forming a first electrode layer over a surface of the recess in which the first electrode layer has a wavy structure; removing the first and second sacrificial layers; and forming a dielectric layer and a second electrode layer over the first electrode layer.

In some embodiments of the present disclosure, the first and second sacrificial layers include tetraethyl orthosilicate, phosphosilicate glass, borosilicate glass, or borophosphosilicate glass.

In some embodiments of the present disclosure, the first sacrificial layers include boron below 0.5 wt % or phosphorus below 0.5 wt %. The second sacrificial layers include boron over 2.5 wt % or phosphorus over 2.5 wt %.

In some embodiments of the present disclosure, each of the first and second sacrificial layers has a thickness ranging from about 2 nm to about 20 nm. The first and second sacrificial layers collectively form a thickness greater than 500 nm.

In some embodiments of the present disclosure, an annealing process is performed to the first and second sacrificial layers before performing the etching process. The annealing process is performed at a temperature ranging from about 600° C. to about 1000° C.

In some embodiments of the present disclosure, performing the etching process to the first and second sacrificial layers includes exposing the first and second sacrificial layers to an etching gas containing hydrogen. The etching gas containing hydrogen includes HF, $NF_3$, $CF_4$, or $SF_6$. Furthermore, the etching gas containing hydrogen can further include $H_2O$.

In some embodiments of the present disclosure, performing the etching process to the first and second sacrificial layers includes exposing the stacking structure to a protective gas containing hydrogen. The protective gas containing hydrogen includes $H_2$, $H_2N_2$, $NH_3$, or $C_xH_y$.

Another aspect of the present disclosure related to a crown capacitor including a first supporting layer, a second supporting layer, a dielectric layer, a second electrode layer, and a five-wavy-layer structure. The first electrode layer at least partially in contact with the first and second supporting layers. The dielectric layer located on two opposite surfaces of the first electrode layer and at least partially in contact with the first and second supporting layers. The second electrode layer in contact with the dielectric layer and at two opposite sides of the first electrode layer. The five-wavy-layer structure formed between the first and second supporting layers in which the five-wavy-layer structure comprises a portion of the first electrode layer disposed between two portions of the dielectric layer which are disposed between two portions of the second electrode layer.

In some embodiments of the present disclosure, the first electrode layer and the dielectric layer collectively wrap a portion of the second supporting layer.

In some embodiments of the present disclosure, the first and second electrode layers comprise titanium nitride.

In some embodiments of the present disclosure, the first and second supporting layers comprise silicon nitride.

In some embodiments of the present disclosure, the five-wavy-layer structure has a plurality of curved portions regularly arranged in two parallel straight rows.

In some embodiments of the present disclosure, the five-wavy-layer structure has a plurality of curved portions irregularly arranged in two parallel straight rows.

In some embodiments of the present disclosure, the five-wavy-layer structure has a plurality of curved portions arranged in two parallel straight rows, and the curved portions are symmetric with respect to the two parallel straight rows.

In summary, the etching process is performed to the sacrificial layers at different etching rates, and thus the first electrode layer which is formed on the surface of the recess extending through the sacrificial layers can have wavy structure. Thereafter, the second electrode layer and the dielectric layer formed on the first electrode layer can also have wavy structures and collectively form the crown capacitor with high capacitance.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
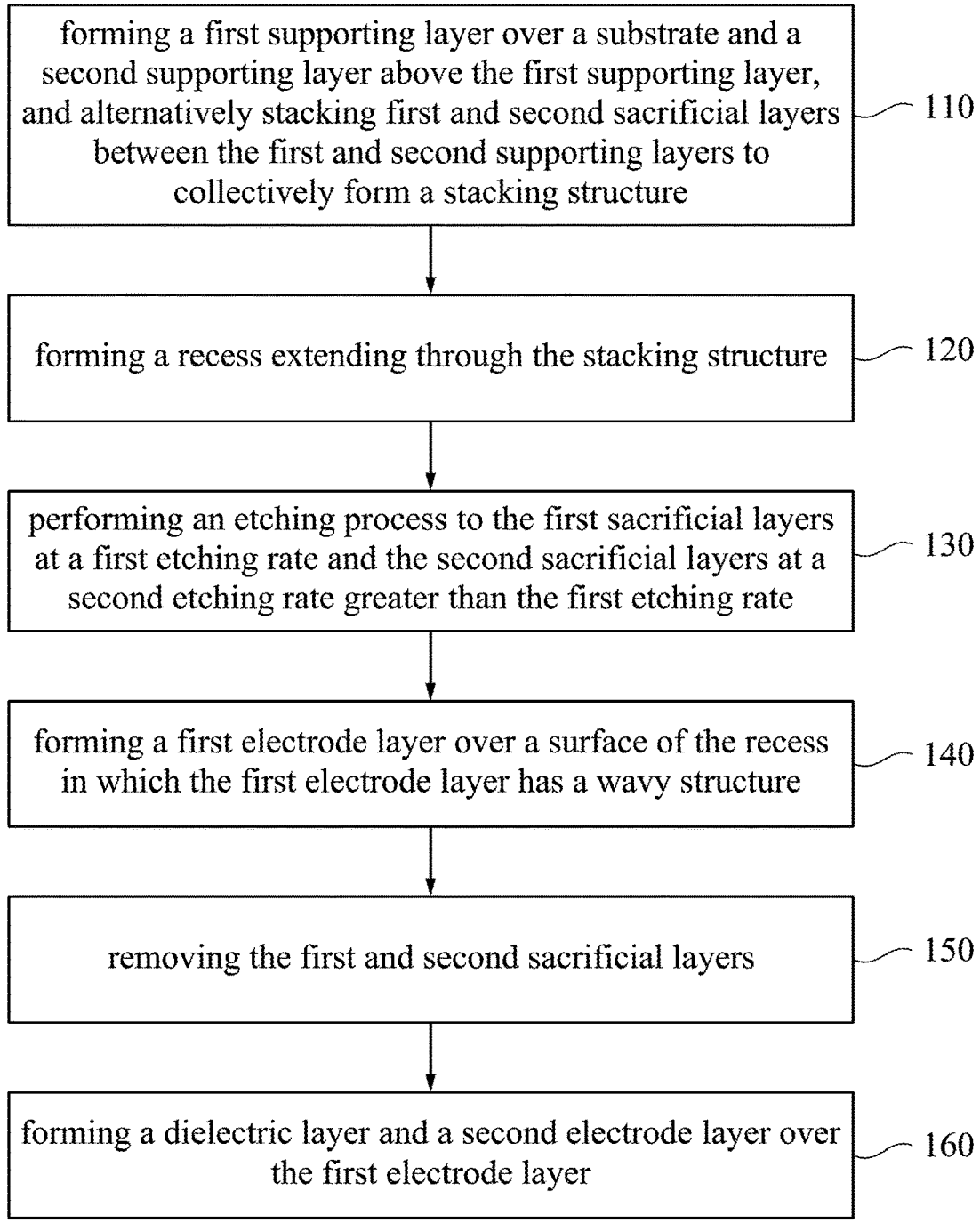
FIG. 1 is a flowchart for fabricating a crown capacitor in accordance with some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

The terms "comprise," "comprising," "include," "including," "has," "having," etc. used in this specification are open-ended and mean "comprises but not limited."

Reference is made to FIG. 1. FIG. 1 illustrates a method 100 for fabricating a crown capacitor in accordance with some embodiments of the present disclosure. The method 100 starts with Step 110 in which a first supporting layer is formed over a substrate, and a second supporting layer is formed above the first supporting layer and. Furthermore, first and second sacrificial layers are alternatively stacked between the first and second supporting layers to collectively form a stacking structure. The method 100 continues with Step 120 in which a recess extending through the stacking structure is formed. Next, the method 100 continues with Step 130 in which an etching process is performed to the first sacrificial layers at a first etching rate and the second sacrificial layers at a second etching rate greater than the first etching rate, such that each second sacrificial layer and immediately-adjacent two of the first sacrificial layers collectively define a concave portion. The method 100 continues with Step 140 in which a first electrode layer is formed over a surface of the recess, and the first electrode layer has a wavy structure. The method 100 then continues with Step 150 in which the first and second sacrificial layers are removed. Further, the method 100 continues with Step 160 in which a dielectric layer and a second electrode layer are formed over the first electrode layer to obtain a crown capacitor.

Figure 2:
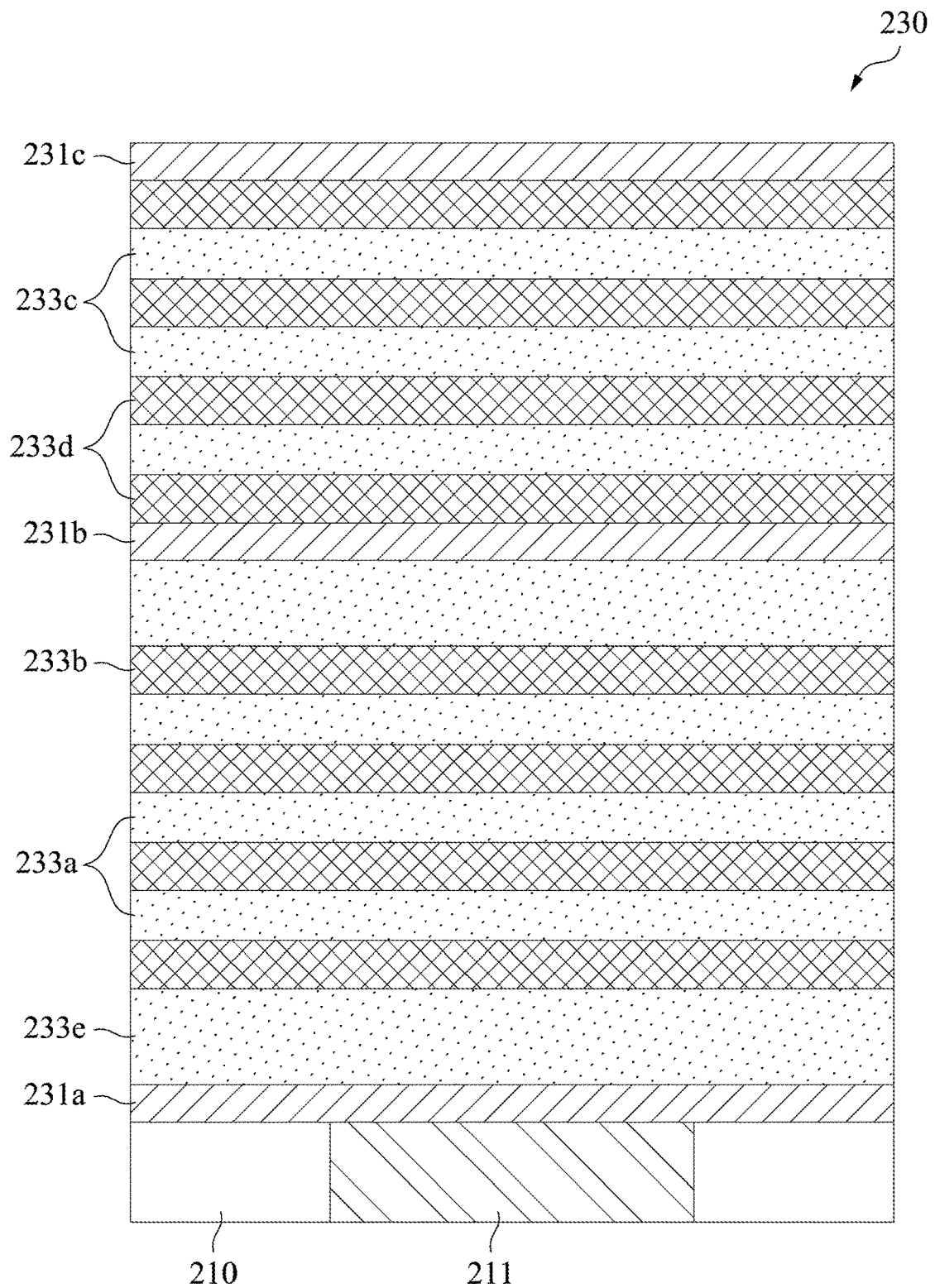
FIG. 2 to FIG. 11 diagrammatically illustrate intermediate steps for fabricating a crown capacitor in accordance with some embodiments of the present disclosure.

Reference is made to FIG. 2. FIG. 2 diagrammatically illustrates Step 110 of FIG. 1. In Step 110, a first supporting layer 231a is formed over a substrate 210. First and second sacrificial layers 233a, 233b are alternatively stacked on the first supporting layer 231a, and then a second supporting layer 231b is formed on the first and second sacrificial layers 233a, 233b, such that a stacking structure 230 is obtained. In some embodiments of the present disclosure, third and fourth sacrificial layers 233c, 233d are further stacked on the second supporting layers 231b, and then a third supporting layer 231c is formed on the third and fourth sacrificial layers 233c, 233d to collectively form the stacking structure 230. The present disclosure is not limited in this in this respect.

Specifically, the substrate 210 can be composed of any construction containing semiconductive material, including, but not limited to, bulk semiconductive materials such as a semiconductive wafer (either alone or in assemblies comprising other materials), and semiconductive material regions (either alone or in assemblies comprising other materials). The substrate 210 includes a conductive structure 211 therein, and the conductive structure 211 includes a conductive material, such as tungsten (W) or an alloy containing tungsten thereof. The present disclosure is not limited in this respect.

The sacrificial layers 233a, 233b, 233c, 233d can include tetraethyl orthosilicate, phosphosilicate glass, borosilicate glass, or borophosphosilicate glass. The present disclosure is not limited in this respect. In an embodiment of the present disclosure, the sacrificial layers 233a, 233c include tetraethyl orthosilicate, and the sacrificial layers 233b, 233d include borophosphosilicate glass. In some embodiments of the present disclosure, the first and third sacrificial layers 233a, 233c respectively include additives therein such as boron (B) below 0.5 wt % or phosphorus (P) below 0.5 wt %. The second and fourth sacrificial layers 233b, 233d respectively include additives therein such as boron over 2.5 wt % or phosphorus over 2.5 wt %. The present disclosure is not limited in this respect.

In some embodiments of the present disclosure, each of the first and second sacrificial layers 233a, 233b has a thickness ranging from about 2 nm to about 20 nm. The first and second sacrificial layers 233a, 233b collectively form a thickness higher than 500 nm. Therefore, the stacking structure 230 is at least thicker than 500 nm. In some embodiments of the present disclosure, each of the sacrificial layers 233c, 233d has a thickness ranging from about 2 nm to about 20 nm. The third and fourth sacrificial layers 233c, 233d on the second supporting layer 231b collectively form a thickness greater than 500 nm. Since the stacking structure 230 includes the sacrificial layers 233a, 233b, 233c, 233d, the stacking structure 230 can have a thickness greater than 1,000 nm. In some embodiments of the present disclosure, each of the supporting layers 231a, 231b, 231c can include a hard material such as silicon nitride to prevent the stacking structure 230 from toppling. The present disclosure is not limited in this respect.

In some embodiments of the present disclosure, the stacking structure 230 further includes a fifth sacrificial layer 233e. The fifth sacrificial layer 233e having a thickness at least 500 nm is directly formed on the first supporting layer 231a. Thereafter, a chemical mechanical polishing process is performed to the fifth sacrificial layer 233e to get a flat surface thereon, and then the first and second sacrificial layers 233a, 233b are formed on the flat surface of the fifth sacrificial layer 233e. The fifth sacrificial layer 233e can also include tetraethyl orthosilicate, phosphosilicate glass, borosilicate glass, or borophosphosilicate glass. The present disclosure is not limited in this respect. In some embodiments of the present disclosure, the fifth sacrificial layer 233e can include an additive therein such as boron (B) below 0.5 wt % or phosphorus (P) below 0.5 wt %. In some other embodiments of the present disclosure, the fifth sacrificial layer 233e can include an additive therein such as boron over 2.5 wt % or phosphorus over 2.5 wt %. The additive in the fifth sacrificial layer 233e can be adjusted depending on the stacking relation among the first and second sacrificial layer 233a, 233b thereon. The present disclosure is not limited in this respect.

Figure 3:
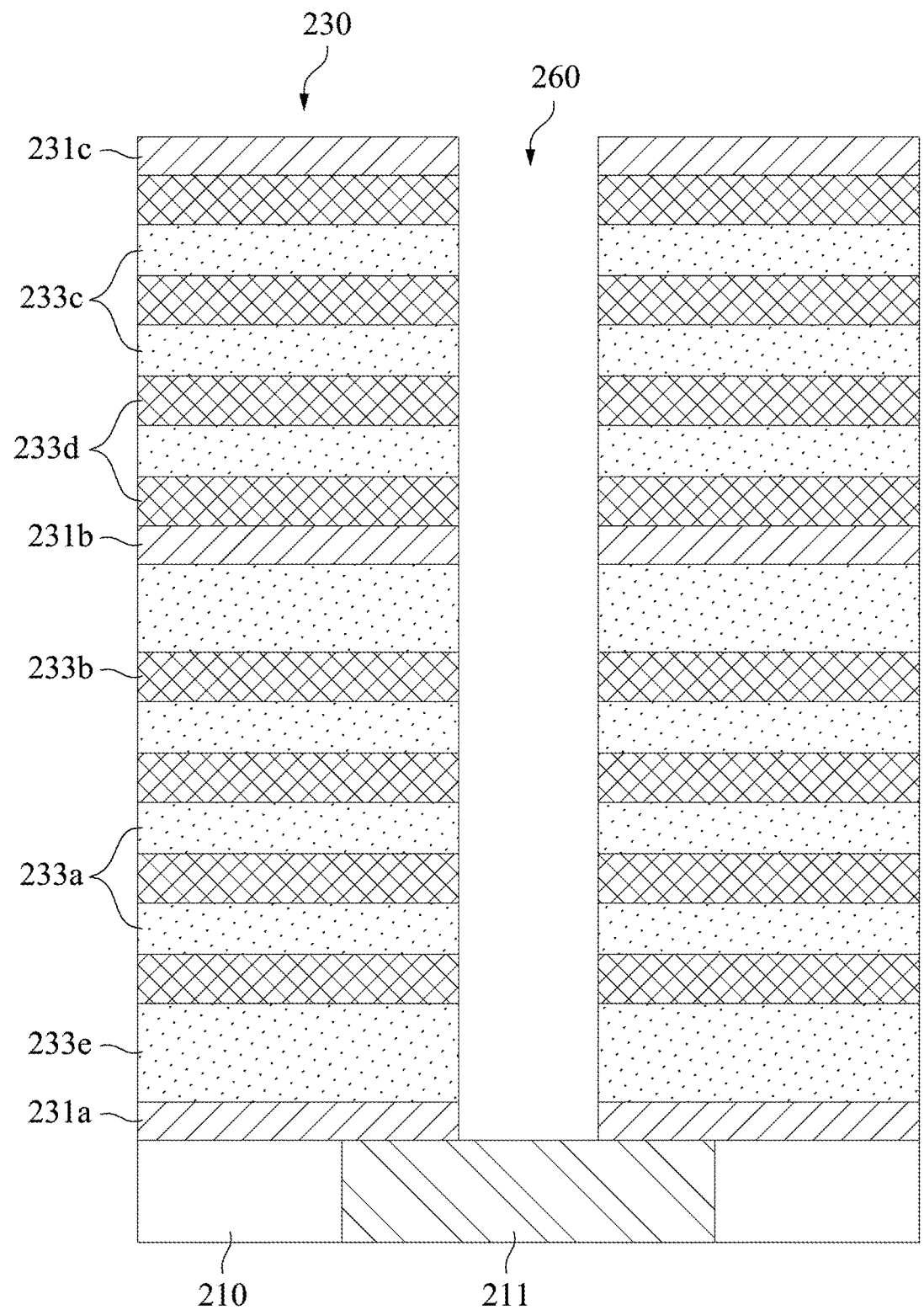

Reference is made to FIG. 2 and FIG. 3. FIG. 2 and FIG. 3 can diagrammatically illustrate Step 120 of FIG. 1 in which a recess 260 extending through the stacking structure is formed. Hence, the conductive structure 211 in the substrate 210 is exposed by the recess 260. The recess 260 can be formed by a dry etching process such as an anisotropic etching process. The anisotropic etching process can include a reactive ion etching (RIE) process or a plasma etching process. The present disclosure is not limited in this respect.

Figure 4:
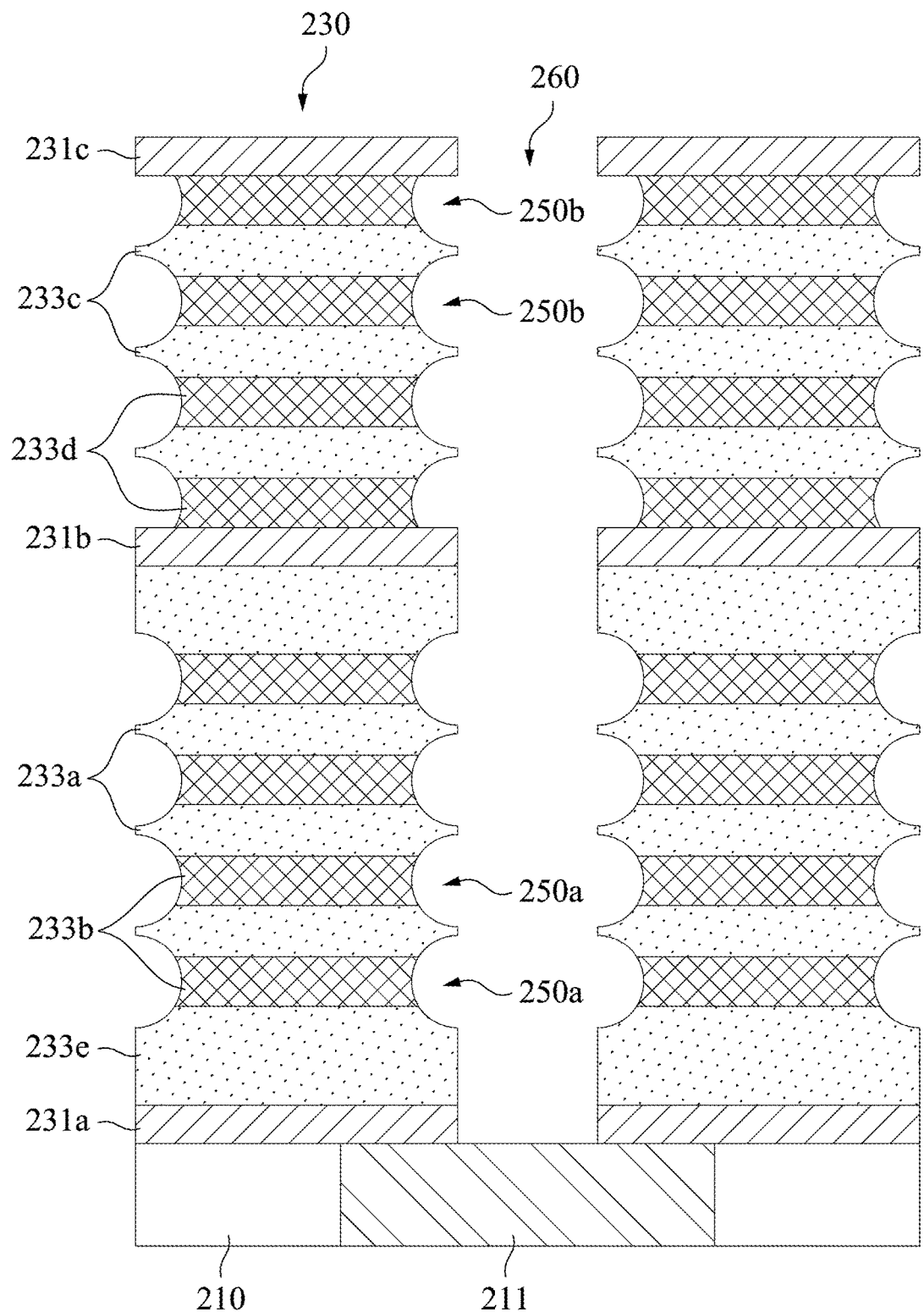

Reference is made to FIG. 3 and FIG. 4. FIG. 3 and FIG. 4 can diagrammatically illustrate Step 130 of FIG. 1 in which an etching process is performed to the first sacrificial layers 230a at a first etching rate and the second sacrificial layers 230b at a second etching rate greater than the first etching rate, such that each second sacrificial layer 230b and immediately-adjacent two of the first sacrificial layers 230a collectively define a concave portion 250a. The second etching rate can be several times greater than the first etching rate, and the ratio relation between the first and second etching rates is determined by the density of the additive and the etching process. The present disclosure is not limited in this respect. In some embodiments of the present disclosure, the etching process is also performed to the third sacrificial layers 233c at a third etching rate and the fourth sacrificial layers 233d at a fourth etching rate greater than the third etching rate, such that each fourth sacrificial layer 233d and immediately-adjacent two of the third sacrificial layers 233c collectively define a concave portion 250b.

In some embodiments of the present disclosure, an annealing process is performed to the sacrificial layers 233a, 233b, 233c, 233d before the etching process. The annealing process is performed at a temperature ranging from about 600° C. to about 1000° C. and conducted from about 10 minutes to about 30 minutes. By performing the annealing process, adjacent two of the sacrificial layers 233a, 233b, 233c, 233d have balanced additive densities. Therefore, the concave portions 250a, 250b can be smooth by conducting the subsequently etching process.

Specifically, the etching process performed to the sacrificial layers 233a, 233b, 233c, 233d includes exposing the sacrificial layers 233a, 233b, 233c, 233d to an etching gas containing hydrogen. The etching gas containing hydrogen can include HF, $NF_3$, $CF_4$, or $SF_6$ to partially remove the sacrificial layers 233a, 233b, 233c, 233d, such that concave portions 250a, 250b can be formed. Moreover, the etching gas containing hydrogen can further include $H_2O$ to increase the efficiency and selectivity about etching the sacrificial layers 233a, 233b, 233c, 233d. The present disclosure is not limited in this respect.

In some embodiments of the present disclosure, Step 130 includes exposing the supporting layers 231a, 231b, 231c and the substrate 210 to a protective gas containing hydrogen before the etching process. The protective gas containing hydrogen can include $H_2$, $H_2N_2$, $NH_3$, or $C_xH_y$, and $C_xH_y$ refers to hydrocarbon in this paragraph. After exposing the stacking structure 230, such as supporting layers 231a, 231b, 231c, and the substrate 210 to the protective gas, protective films, such as $Ni_3N_4H$ and WH, can be formed over the supporting layers 231a, 231b, 231c as well as the conductive structure 211. In this case, the supporting layers 231a, 231b, 231c and the conductive structure 211 are barely affected by the etching gas containing hydrogen, thereby increasing etching selectivity among conductive structure 211, the supporting layers 231a, 231b, 231c, and the sacrificial layers 233a, 233b, 233c, 233d.

In some embodiments of the present disclosure, a pumping process can be performed to gas products produced by the etching gas containing hydrogen. For instance, while the sacrificial layers 233a, 233b, 233c, 233d are exposed to hydrogen fluoride (HF), the gas products, such as $SiF_4$ and $H_2SiF_6$, are subsequently produced. By performing such pumping process, the gas products can be efficiently removed, thereby preventing the gas products from affecting formation of the concave portions 250a, 250b. In some embodiments of the present disclosure, the etching process and the pumping process can be conducted repeatedly and cyclically, and thus the densities of the etching gas and the gas products thereof can be well controlled. In this way, concave portions 250a, 250b can be form efficiently.

Figure 5:
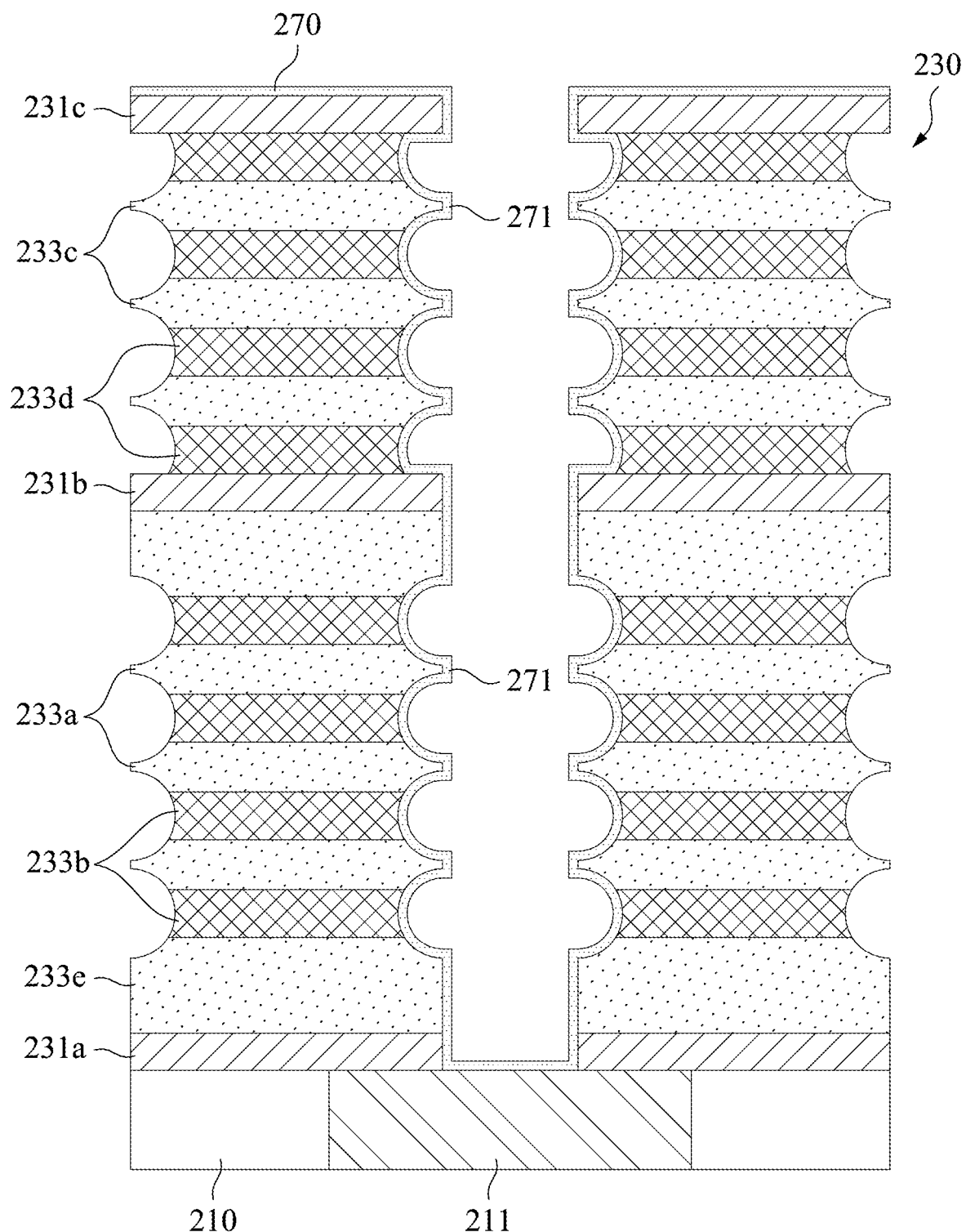
Figure 6:
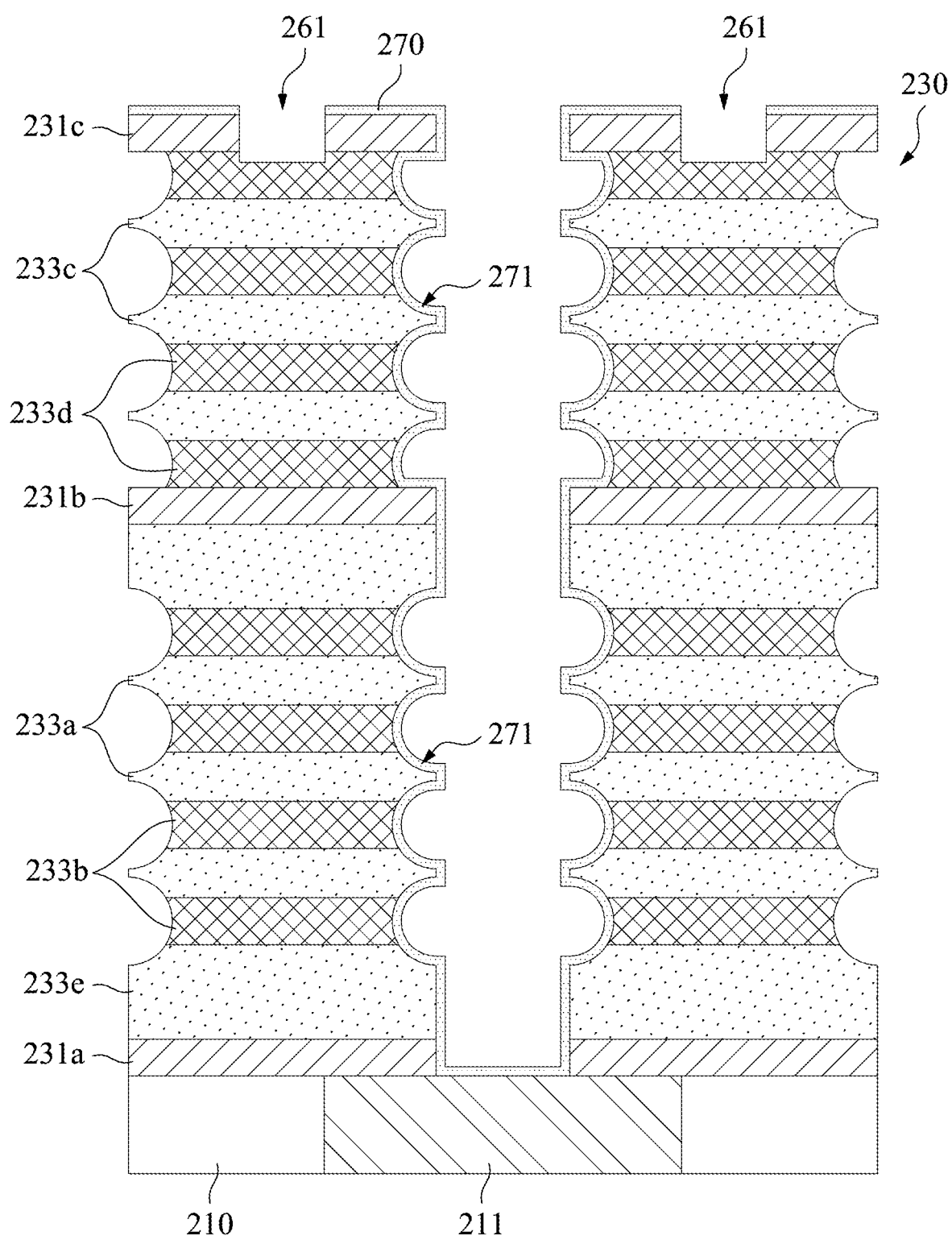

Reference is made to FIG. 4 and FIG. 5. FIG. 4 and FIG. 5 can diagrammatically illustrate Step 140 of FIG. 1 in which a first electrode layer 270 is formed over a surface of the recess 260, such as a sidewall and a bottom surface of the recess 260. Moreover, the first electrode layer 270 has a wavy structure 271 since the first electrode layer 270 is formed over the concave portions 250a, 250b. The first electrode layer 270 is in contact with the conductive structure 211 in the substrate 210. The first electrode layer 270 can include a conductive material such as titanium nitride (TiN). In some embodiments of the present disclosure, the first electrode layer 270 can be formed by a deposition process, such as an atomic layer deposition (ALD) process, a physical vapor deposition (PVD) process, a chemical vapor deposition (CVD) process, or a low pressure chemical vapor deposition (LPCVD) process. The present disclosure is not limited in this respect.

Figure 7:
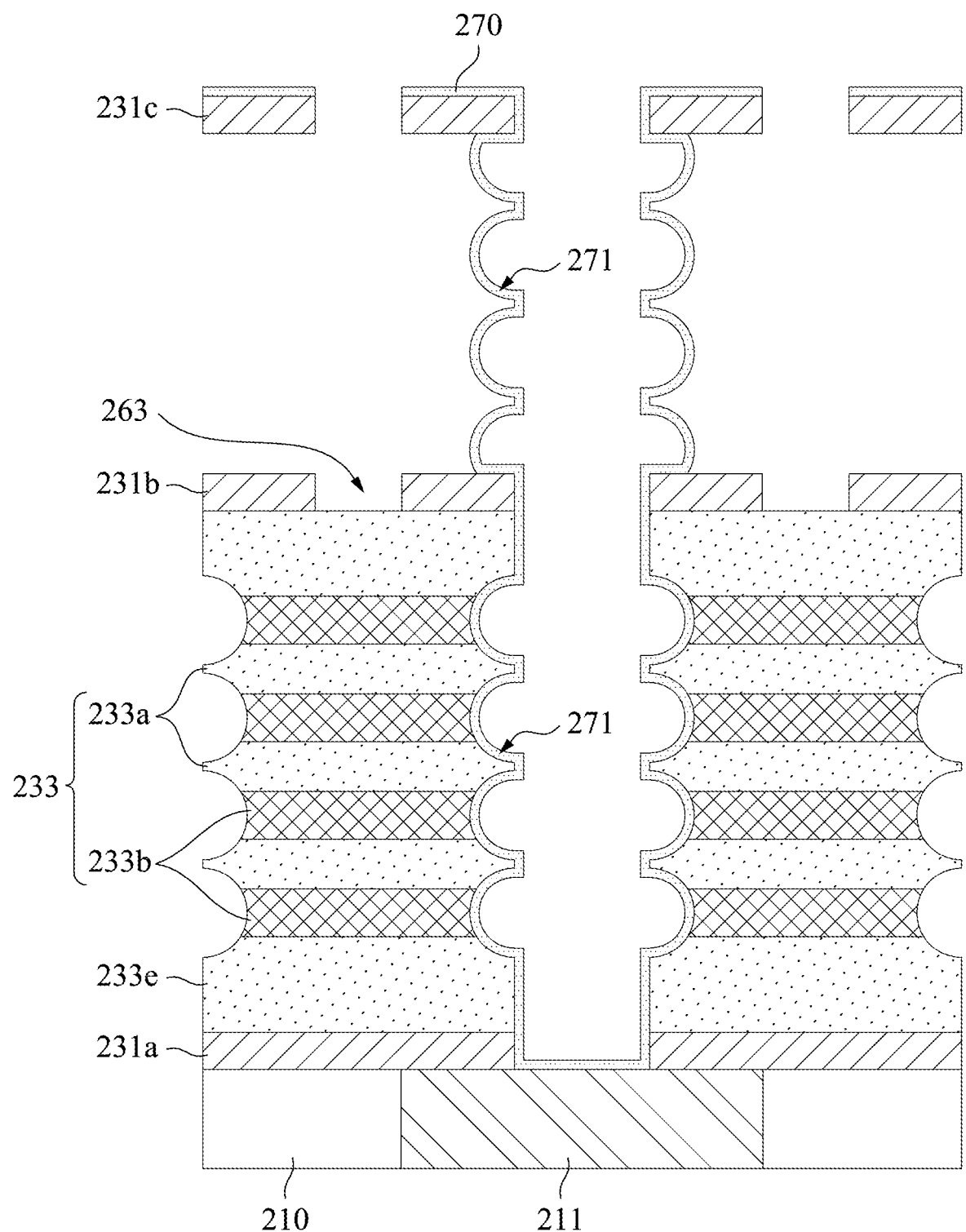
Figure 8:
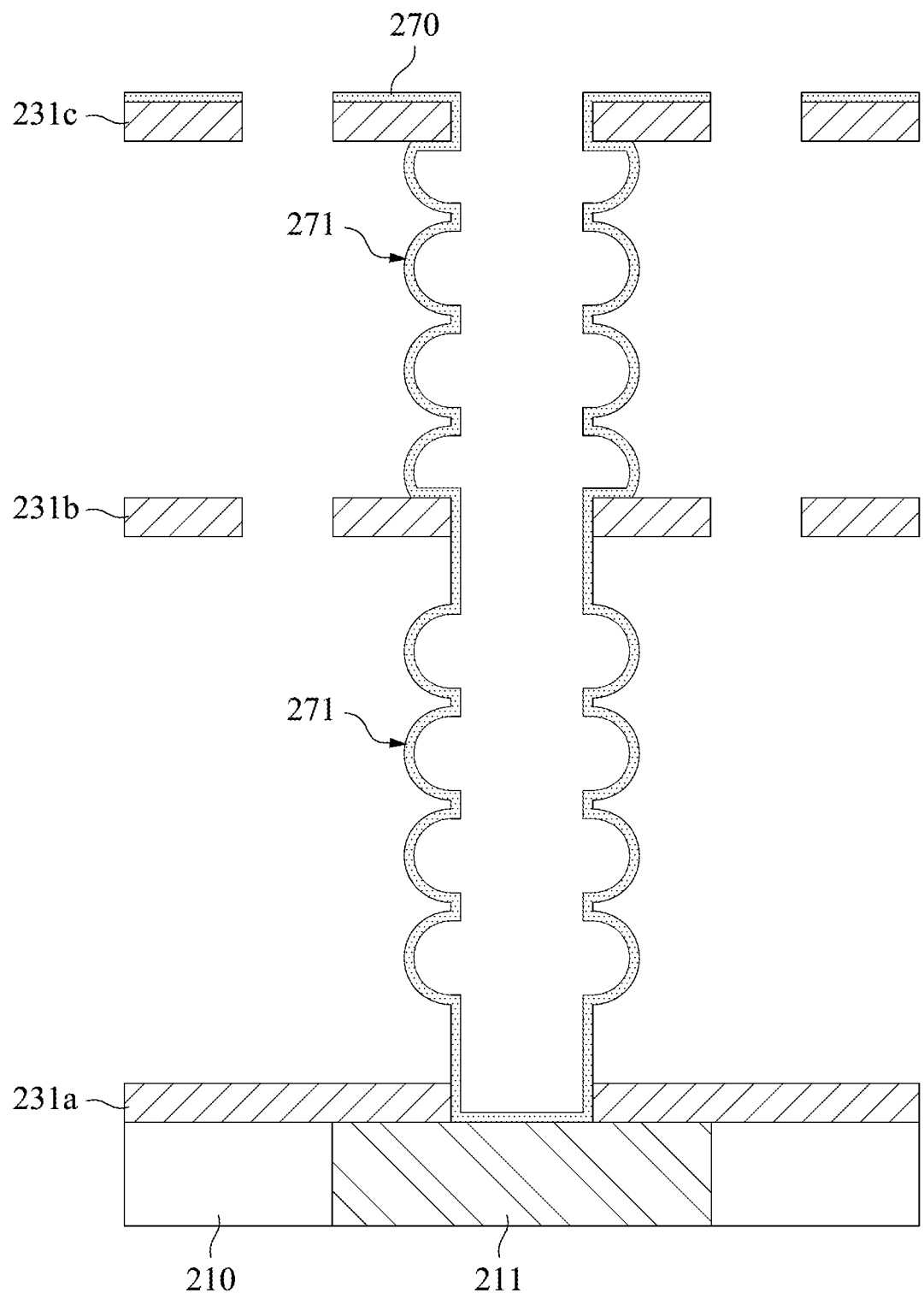

Reference is made from FIG. 5 to FIG. 8. FIG. 5 through FIG. 8 can diagrammatically illustrate Step 150 of FIG. 1 in which the sacrificial layers 233a, 233b, 233c, 233d are removed. According to FIG. 5 and FIG. 6, an opening 261 extending through the third supporting layer 231c and the first electrode layer 270 is formed. Thereafter, a wet etching process is conducted through the opening 261 to remove the sacrificial layers 233c, 233d, and then another opening 263 extending through the second supporting layer 231b is formed in accordance with FIG. 6 and FIG. 7. Specifically, the wet etching process includes exposing the sacrificial layers 233c, 233d to a solvent containing hydrogen fluoride (HF) through the opening 261 to selectively remove the sacrificial layers 233c, 233d. Reference is subsequently made to FIG. 7 and FIG. 8, and the wet etching process is also conducted through the opening 263 to remove the sacrificial layers 233a, 233b. Similarly, the solvent containing hydrogen fluoride (HF) can selectively remove the sacrificial layers 233a, 233b through the opening 263. The openings 261, 263 can be formed by the aforementioned anisotropic etching process. The present disclosure is not limited in this respect.

Figure 9:
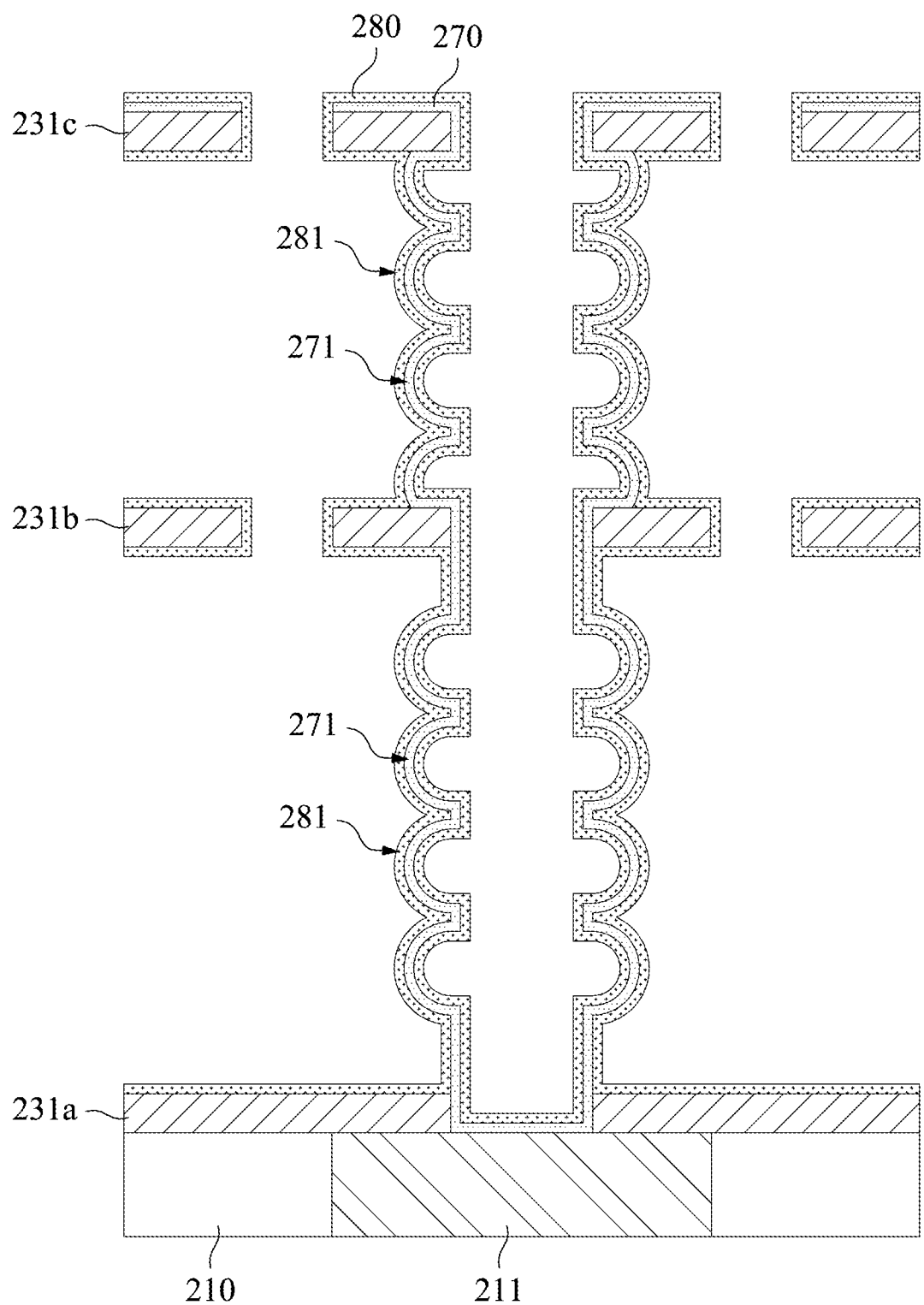
Figure 10:
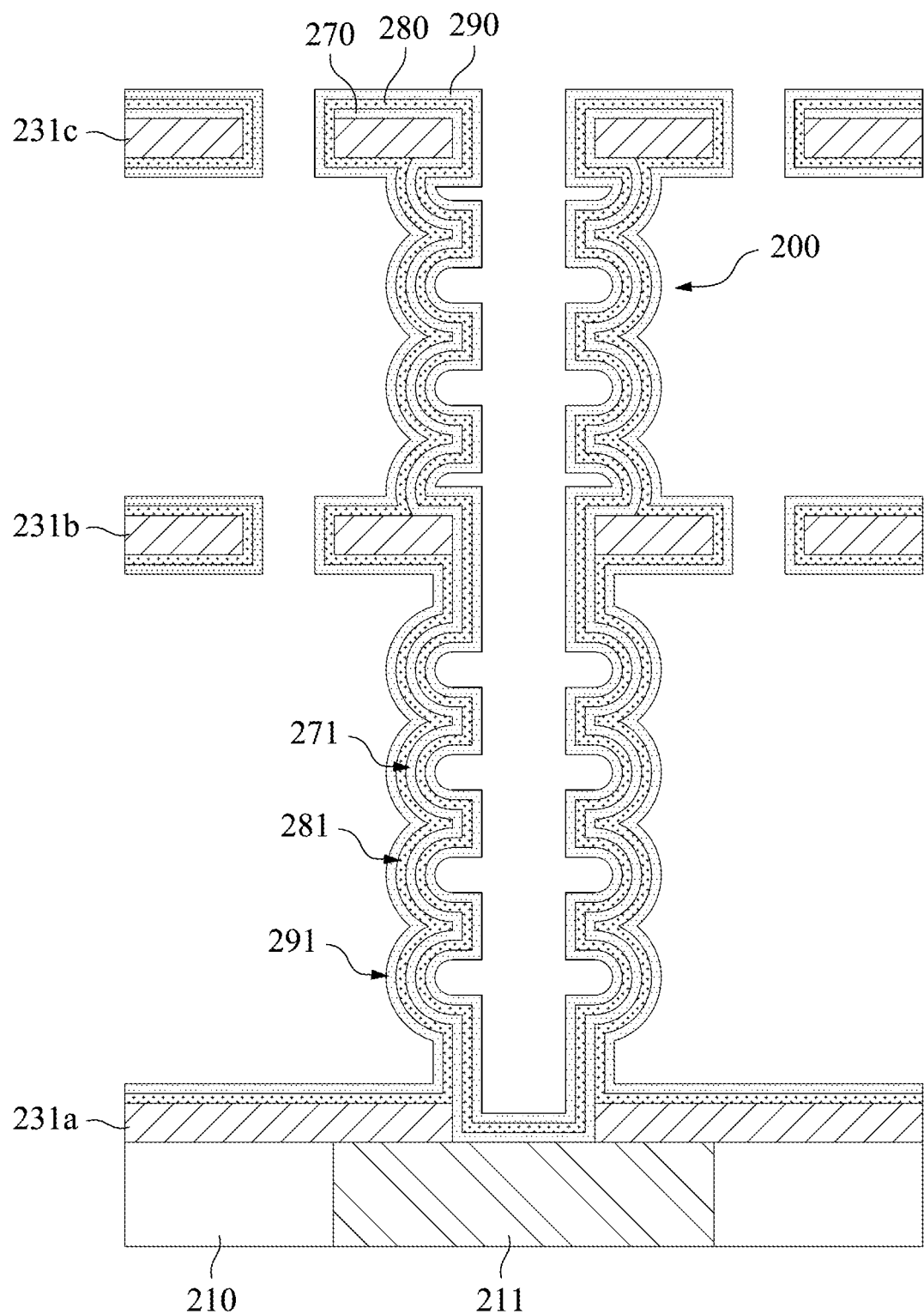

Reference is made from FIG. 8 to FIG. 10. FIG. 8 through FIG. 10 can diagrammatically illustrate Step 160 of FIG. 1. In some embodiments of the present disclosure, a dielectric layer 280 is formed over the first electrode layer 270 in accordance with FIG. 8 and FIG. 9. Specifically, the dielectric layer 280 is formed on two opposite sides of the first electrode layer 270. Thereafter, a second electrode layer 290 is formed over the dielectric layer 280 to obtain a crown capacitor 200 in accordance with FIG. 9 and FIG. 10. Specifically, the second electrode layers 290 are at the two opposite sides of the first electrode layer 270, and thus the dielectric layer 280 is located between the first and second electrode layers 270, 290, thereby forming a five-layer capacitor structure. In some embodiments of the present disclosure, the dielectric layer 280 includes a high dielectric constant (high-k) dielectric material having a dielectric constant greater than silicon oxide. The second electrode layer 290 includes a conductive material such as titanium nitride (TiN). The dielectric layer 280 and the second electrode layer 290 can be formed by the aforementioned deposition process. The present disclosure is not limited in this respect.

Figure 11:
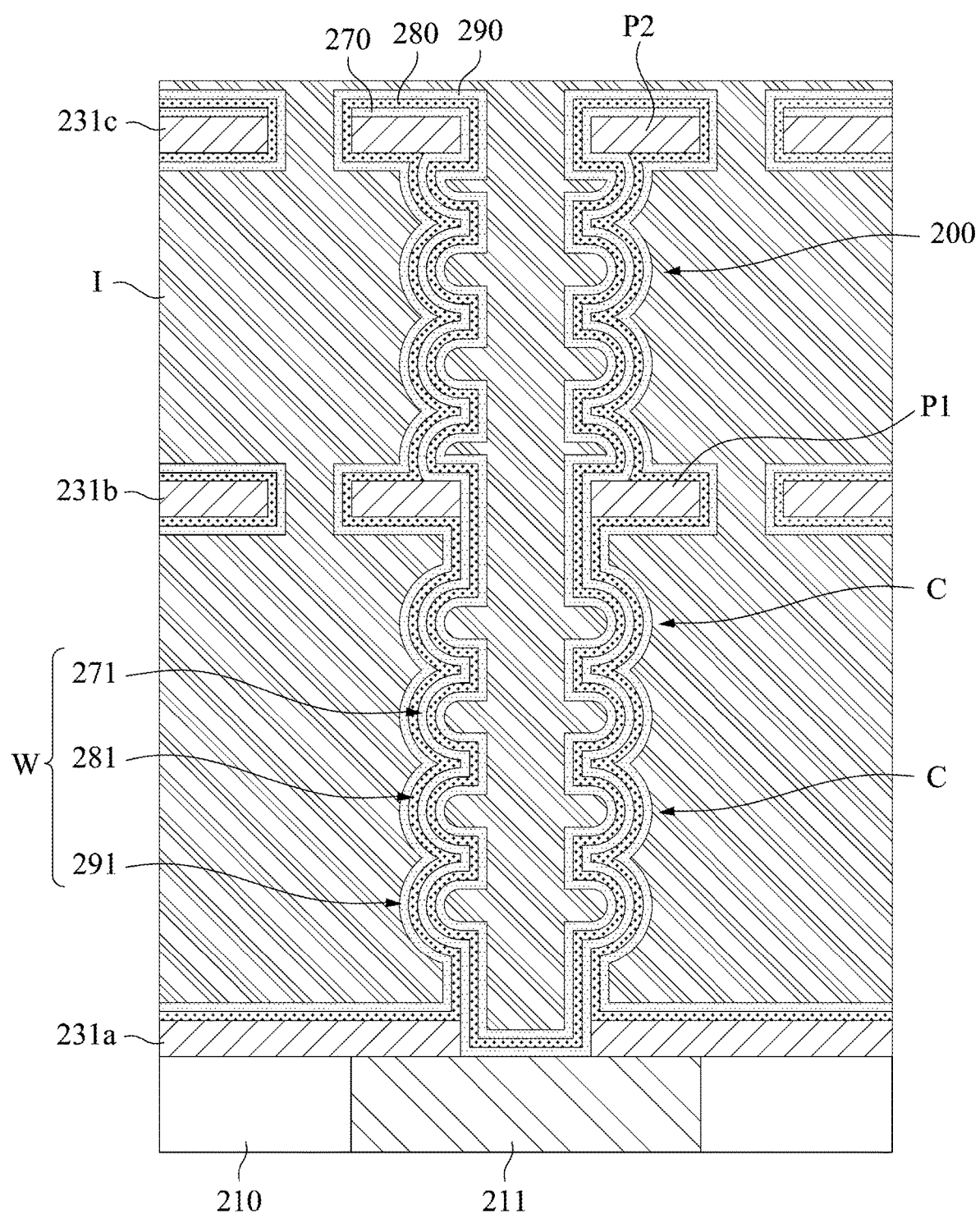

After Step 160, a semiconductive structure I can be formed over the second electrode layers 290 to protect the crown capacitor 200 and the grounding part thereof in accordance with FIG. 10 and FIG. 11. Specifically, the semiconductive structure I can include a doped polycrystalline material, such as boron doped polysilicon, or germanium doped polysilicon, thereby decreasing the deposition rate and improving the step coverage of the semiconductive structure I. The present disclosure is not limited in this respect.

Reference is made to FIG. 11. According to FIG. 11, a crown capacitor 200 includes a substrate 210, a first electrode layer 270, a dielectric layer 280, and a second electrode layer 290. The first electrode layer 270 is located on the substrate 210, and the first electrode layer 270 is in contact with the conductive structure 211 in the substrate 210. The dielectric layer 280 is located on two opposite surfaces of the first electrode layer 270. The second electrode layer 290 is over the dielectric layer 280 and located at two opposite sides of the first electrode layer 270. In this case, the dielectric layer 280 is located between the first and second electrode layers 270, 290, and thus the dielectric layer 280 and the first and second electrode layers 270, 290 collectively form the crown capacitor 200.

In some embodiments of the present disclosure, the crown capacitor 200 further includes supporting layers 231a, 231b, 231c. The first electrode layer 270 is at least partially in contact with the supporting layers 231b, 231c. The dielectric layer 280 on the two opposite surfaces of the first electrode layer 270 is at least partially in contact with the supporting layers 231b, 231c. Therefore, the first electrode layer 270 and the dielectric layer 280 collectively wrap portions P1, P2 of the supporting layers 231b, 231c to form close-loop rings around the portions P1, P2 of the supporting layers 231b, 231c.

In some embodiments of the present disclosure, the first and second electrode layers 270, 290 and the dielectric layer 280 respectively have wavy structures 271, 281, 291 immediately in contact. The wavy structures 271, 281, 291 collectively form a five-wavy-layer structure W of the crown capacitor 200. The five-wavy-layer structure W is located between the first and second supporting layers 231a, 231b, but the present disclosure is not limited in this respect. In some embodiments of the present disclosure, the five-wavy-layer structure W can also be located between the second and third supporting layers 231b, 231c.

Specifically, the five-wavy-layer structure W includes a portion of the first electrode layer 270, two portions of the dielectric layer 280, and two portions of the second electrode layer 290. The portion of the first electrode layer 270 is located between the two portions of the dielectric layer 280 and located between two portions of the second electrode layer 290. Moreover, the two portions of the dielectric layer 280 are also located between two portions of the second electrode layer 290.

In some embodiments of the present disclosure, the five-wavy-layer structure W includes a plurality of curved portions C regularly arranged in two parallel straight rows. For instance, each curve portion C in the same straight row is spaced apart with an adjacent one by the same distance. The five-wavy-layer structure W can also include curved portions C irregularly arranged in two parallel straight rows. The present disclosure is not limited in this respect. In some embodiments of the present disclosure, the curved portions C can not only be arranged in two parallel straight rows but also be symmetric in accordance with the two parallel straight rows. Moreover, the isolated structure I covers the first electrode layer 270, the dielectric layer 280, and the second electrode layer 290 of the crown capacitor 200 to prevent the crown capacitor 200 from negative influence.

In summary, the etching process is performed to the sacrificial layers at different etching rates, and thus the first electrode layer which is formed on the surface of the recess extending through the sacrificial layers can have wavy structure. Thereafter, the second electrode layer and the dielectric layer formed on the first electrode layer can also have wavy structures and collectively form the crown capacitor with high capacitance.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A crown capacitor comprising:
    a substrate;
    a first supporting layer disposed above the substrate;
    a second supporting layer disposed above the first supporting layer and spaced apart from the first supporting layer, wherein the second supporting layer is farther from the substrate than the first supporting layer;
    a first electrode layer at least partially in contact with the first and second supporting layers;
    a dielectric layer disposed on two opposite surfaces of the first electrode layer and at least partially in contact with the first and second supporting layers; and
    a second electrode layer disposed in contact with the dielectric layer and at two opposite sides of the first electrode layer; and
    at least one five layer structure formed between the first and second supporting layers, wherein the five layer structure extends in a curved configuration and along a direction perpendicular to a top surface of the substrate, the five layer structure comprises a portion of the first electrode layer disposed between two portions of the dielectric layer and disposed between two portions of the second electrode layer, wherein the five layer structure further extends in the direction perpendicular to and away from the top surface of the substrate, and the five layer structure diverges at the second supporting layer to completely wrap around and form a closed-loop ring around a portion of the second supporting layer.

2. The crown capacitor of claim 1, wherein the first electrode layer and the dielectric layer collectively wrap a portion of the second supporting layer.

3. The crown capacitor of claim 1, wherein the first and second electrode layers comprise titanium nitride.

4. The crown capacitor of claim 1, wherein the first and second supporting layers comprise silicon nitride.

5. The crown capacitor of claim 1, wherein the five-layer structure comprises first and second pluralities of five layer curved portions respectively regularly arranged in two parallel rows, wherein the two parallel rows extend along the direction perpendicular to the top surface of the substrate.

6. The crown capacitor of claim 1, wherein the at least one five-wavy-layer structure comprises a plurality of curved portions arranged in two rows.

7. The crown capacitor of claim 1, wherein the five-wavy-layer structure comprises a plurality of curved portions arranged in two rows, the curved portions are symmetric with respect to the two rows.

8. A crown capacitor comprising:
   a substrate;
   a first supporting layer disposed above the substrate;
   a second supporting layer disposed above the first supporting layer and spaced apart from the first supporting layer, wherein the second supporting layer is farther from the substrate than the first supporting layer;
   a first electrode layer at least partially in contact with the first and second supporting layers;
   a dielectric layer disposed on two opposite surfaces of the first electrode layer and at least partially in contact with the first and second supporting layers; and
   a second electrode layer disposed in contact with the dielectric layer and at two opposite sides of the first electrode layer; and
   at least one five layer structure formed between the first and second supporting layers, wherein the five layer structure extends in a curved configuration and along a direction perpendicular to a top surface of the substrate, the five layer structure comprises a portion of the first electrode layer disposed between two portions of the dielectric layer and disposed between two portions of the second electrode layer, and wherein the at least one five layer structure comprises a first row of multiple five layer curved portions higher than the first supporting layer and lower than the second supporting layer and a second row of multiple five layer curved portions higher than the first supporting layer and lower than the second supporting layer, wherein the five layer structure further extends in the direction perpendicular to and away from the top surface of the substrate, and the five layer structure diverges at the second supporting layer to completely wrap around and form a closed-loop ring around a portion of the second supporting layer.

9. The crown capacitor of claim 8, wherein the first electrode layer and the dielectric layer collectively wrap a portion of the second supporting layer.

10. The crown capacitor of claim 8, wherein the first and second electrode layers comprise titanium nitride.

11. The crown capacitor of claim 8, wherein the first and second supporting layers comprise silicon nitride.

12. The crown capacitor of claim 8, wherein the first and second rows of multiple five layer curved portions are two parallel rows, wherein the two parallel rows extend along the direction perpendicular to the top surface of the substrate.

* * * * *